United States Patent
Shveykin (10) Patent No.: US 7,839,909 B2
(45) Date of Patent: Nov. 23, 2010

(54) HETEROSTRUCTURE, INJECTOR LASER, SEMICONDUCTOR AMPLIFYING ELEMENT AND A SEMICONDUCTOR OPTICAL AMPLIFIER A FINAL STAGE

(75) Inventor: Vasily Ivanovich Shveykin, Moscow (RU)

(73) Assignee: General Nano Optics Limited, Nicosia (CY)

( * ) Notice: Subject to any disclaimer, the term of this patent is extended or adjusted under 35 U.S.C. 154(b) by 470 days.

(21) Appl. No.: 11/719,536

(22) PCT Filed: Nov. 15, 2005

(86) PCT No.: PCT/RU2005/000566

§ 371 (c)(1),
(2), (4) Date: May 16, 2007

(87) PCT Pub. No.: WO2006/054920

PCT Pub. Date: May 26, 2006

(65) Prior Publication Data

US 2009/0147812 A1    Jun. 11, 2009

(30) Foreign Application Priority Data

Nov. 17, 2004   (RU)   ................ 2004133420

(51) Int. Cl.
*H01S 5/00*   (2006.01)
(52) U.S. Cl. .............. 372/44.01; 372/43.01; 372/45.01; 359/344
(58) Field of Classification Search ................ 372/44.01
See application file for complete search history.

(56) References Cited

U.S. PATENT DOCUMENTS 5,383,214 A * 1/1995 Kidoguchi et al. ....... 372/45.01
6,411,637 B1 * 6/2002 Hashimoto ............... 372/45.01

FOREIGN PATENT DOCUMENTS

| RU | 2197047 C1 | 1/2003 |
| RU | 2197048 C1 | 1/2003 |
| RU | 2197049 C1 | 1/2003 |

OTHER PUBLICATIONS

P.G. Eliseev, et al., Semiconductor Lasers, Kvantovaya Electronica, 24. No. 12, 1997, pp. 1067, 1073, 1074, and 1079.

* cited by examiner

*Primary Examiner*—Armando Rodriguez
*Assistant Examiner*—Xnning Niu
(74) *Attorney, Agent, or Firm*—Haynes and Boone, LLP; Pavel I. Pogodin

(57) ABSTRACT

The heterostructures are used for creation of semiconductor injection emission sources: injection lasers, semiconductor amplifying elements, semiconductor optical amplifiers that are used in fiber optic communication and data transmission systems, in optical superhigh-speed computing and switching systems, in development of medical equipment, laser industrial equipment, frequency-doubled lasers, and for pumping solid-state and fiber lasers and amplifiers. The heterostructure, the injection laser, the semiconductor amplifying element, and the semiconductor optical amplifier are proposed, the essential distinction of which consists in modernization of the active region and the leak-in region of the heterostructure, combined choice of location, compositions, refractive indices and thicknesses of the heterostructure layers providing the efficient functioning of the injection lasers, the semiconductor amplifying elements and the semiconductor optical amplifiers in the transient region of formation of controllable emission leak from the active layer.

18 Claims, 3 Drawing Sheets

HETEROSTRUCTURE, INJECTOR LASER, SEMICONDUCTOR AMPLIFYING ELEMENT AND A SEMICONDUCTOR OPTICAL AMPLIFIER A FINAL STAGE

FIELD OF THE INVENTION

The present invention relates to the key components of quantum electronic engineering, namely—to a heterostructure based on semiconductor compounds, an injection laser, a semiconductor amplifying element, and a semiconductor optical amplifier.

DESCRIPTION OF THE RELATED ART

Heterostructures are the base element for manufacturing of the efficient, high-power and compact semiconductor injection emission sources (hereinafter referred to as "IES") with a narrow far-field pattern.

Heterostructures for a semiconductor IES with leaky emission of a narrow far-field pattern are known [U.S. Pat. No. 4,063,189, 1977, H01S 3/19 331/94.5], [Patent 2142665 RU, 10.08.1998, H01S 3/19].

From the standpoint of the technical result being solved an exemplary heterostructure is proposed in [Patent 2197049 RU, V. I. Shveikin, Russia, 18.02.2002, H01S 5/32]. The said prototype of heterostructure is based on semiconductor compounds and contains at least one active layer consisting at least of one sublayer; the leak-in region made transparent for emission that leaks-in into said leak-in region, the leak-in region located at least on one side of the active layer, the leak-in region is at least one; the leak-in region has at least one leak-in layer consisting at least of one sublayer. The said heterostructure is characterized by the ratio of the effective refractive index $n_{eff}$ of the heterostructure to the refractive index $n_{IN}$ of the leak-in layer. At that, in the heterostructure at least two reflective layers are placed additionally at least as one on each side of the active layer; the said reflective layers have refractive indices lesser than $n_{eff}$ and formed at least of one sublayer. The leak-in region is located between the active layer and a corresponding reflective layer. In the said leak-in region two additional layers are formed, namely—a confining layer of the leak-in region adjacent to the surface of the active layer, the said confining layer formed at least of one sublayer, made of a semiconductor with a band gap exceeding the band gap of the active layer, and—an adjusting layer of the leak-in region adjacent to the surface of the confining layer, the said adjusting layer formed at least of one sublayer. Further, the leak-in layer is located in the leak-in region. The ratio of $n_{eff}$ to $n_{IN}$ is determined within the range from one minus delta to one plus delta, where delta is a magnitude much lesser than one.

This prototype heterostructure has a number of significant advantages. The technology for manufacturing is simplified; in operation of the IES based on this heterostructure with leaky emission the output of emission which is approximately normal to the cavities of the cleaved optical facets is attained; the output emission power is increased; the size of the emitting area in the vertical plane is increased, and, correspondingly, the angular divergence of emission is decreased. At the same time the said heterostructure limits the possible attainment of higher energy and spatial characteristics of the IES manufactured on its basis.

Injection lasers with leaky emission and with a narrow far-field pattern are known [U.S. Pat. No. 4,063,189, 1977, H01S 3/19, 331/94.5 H], [Patent 2142665 RU, 10.08.1998, H01S 3/19].

From the standpoint of the technical result and the technical problem being solved, an exemplary prototype injection laser is proposed in [Patent 2197048 RU, V. I. Shveikin, Russia, 18.02.2002, 7 H01S 5/32]. The said prototype injection laser includes a heterostructure based on semiconductor compounds. The said heterostructure contains at least one active layer consisting at least of one sublayer, the leak-in region made transparent for emission that leaks-in into said leak-in region, the leak-in region located at least on one side of the active layer, the leak-in region is at least one, the leak-in region has at least one leak-in layer consisting at least of one sublayer. The said heterostructure is characterized by the ratio of the effective refractive index $n_{eff}$ of the heterostructure to the refractive index $n_{IN}$ of the leak-in layer. Beside of the heterostructure, the prototype injection laser also comprises optical facets, reflectors, ohmic contacts, as well as an optical resonator, in which at least part of its medium is made at least of part of the leak-in region, and at least of part of the active layer. In the said heterostructure at least two reflective layers are placed additionally, at least as one on each side of the active layer; the said reflective layers have the refractive indices lesser than $n_{eff}$ and formed at least of one sublayer. The leak-in region is located between the active layer and a corresponding reflective layer. In the said leak-in region two additional layers are formed, namely—a confining layer of the leak-in region adjacent to the surface of the active layer, the confining layer formed of at least one sublayer, made of a semiconductor with a band gap exceeding the band gap of the active layer; and—an adjusting layer of the leak-in region adjacent to the surface of the confining layer, the adjusting layer formed of at least one sublayer. Further, the said leak-in layer is located in the said leak-in region wherein at least a part of the said reflective layer serves as an additional medium for the optical resonator. The ratio of $n_{eff}$ to $n_{IN}$ is determined within the range from one minus delta to one plus delta, where delta is determined by the magnitude much lesser than one. In operation of the prototype injection laser for given values of overthreshold currents the intensity of laser emission confined in the active layer, defined by the compositions and thicknesses of the heterostructure layers, is no less than its value which is necessary for maintenance of the lasing threshold.

The main advantages of the prototype injection laser are the augmentation of the laser output power, the enlargement of the size of the emitting area in the vertical plane and, correspondingly, the decrease of the angular divergence of emission, the simplification of the technology for manufacturing the injection lasers as well as the realization of emission output which is approximately normal to the cavities of cleaved optical facets. At the same time the prototype injection laser to a certain degree limits the attainment of low lasing threshold currents, as well as high efficiency and power of laser emission together with its high spatial characteristics.

Semiconductor amplifying elements (SAE) are known [Laser Focus World, September 2001, pp. 73-79].

From the standpoint of the technical result being solved, an exemplary prototype semiconductor amplifying element is proposed in [Patent 2197047 RU, V. I. Shveikin, Russia, 18.02.2002, 7 H01S 5/32]. The said SAE includes a heterostructure based on semiconductor compounds, containing at least one active layer consisting at least of one sublayer, and the leak-in region made transparent for emission that leaks-in into said leak-in region, the leak-in region located at least on one side of the active layer, the leak-in region is at least one, the leak-in region has at least one leak-in layer consisting at least of one sublayer. The said heterostructure is characterized by the ratio of the effective refractive index $n_{eff}$ of the heterostructure to the refractive index $n_{IN}$ of the said leak-in layer. Beside of the heterostructure, the prototype SAE also encompasses optical facets, reflectors, ohmic contacts and the clarifying film at least on one an optical facet. In operation of the semiconductor amplifying element the propagation medium of amplified emission is at least part of the said leak-in region and at least part of the active layer. In the said heterostructure at least two reflective layers are placed additional, at least as one on each side of the active layer; the said reflective layers have refractive indices lesser than $n_{eff}$ and formed at least of one sublayer. The leak-in region is located between the active layer and a corresponding reflective layer. In the leak-in region two additional layers are formed, namely—a confining layer of the leak-in region adjacent to the surface of the active layer, the confining layer formed of at least of one sublayer and made of a semiconductor with a band gap exceeding the band gap of the active layer; and—an adjusting layer of the leak-in region adjacent to the surface of the confining layer, the adjusting layer formed of at least one sublayer. Further, in the leak-in region the leak-in layer is located. The ratio of $n_{eff}$ to $n_{IN}$ is determined within the range from one minus delta to one plus delta, where delta is determined by magnitude much lesser than one. In operation of the semiconductor amplifying element an additional medium of the amplified emission is at least a part of the said reflective layer, while the intensity of amplified emission confined in the said active layer, defined by the compositions and thicknesses of the heterostructure layers and the reflection coefficients of the clarifying films, is chosen lesser than its magnitude at the threshold density of self-excitation current.

The main advantages of the prototype SAE are the simplification of its manufacturing technology, the output of the emission which is approximately normal to the cleaved optical facets, the larger entrance and exit apertures, the reduced noise factor, the reduced sensitivity to polarization of the input master emission, as well as small angle of the emission divergence. At the same time the prototype SAE has an insufficient sensitivity to an input signal and certain restrictions on the magnitude of the small-signal amplification coefficient.

Semiconductor optical amplifiers (SOA) are known [IEEE Photonics Technology Letters, Vol. 11, No. 9, September 1999, pp. 1099-1101].

From the standpoint of the technical result being solved an exemplary prototype semiconductor optical amplifier is proposed in [Patent 2197047 RU, V. I. Shveikin, Russia, 18.02.2002, 7 H01S 5/32].

The prototype SOA includes optically coupled master source of input emission and prototype SAE proposed in [Patent 2197047 RU, V. I. Shveikin, Russia, 18.02.2002, 7 H01S 5/32] and presented above on pp. 3-4.

The main advantages of the prototype SOA are simplification of the manufacturing technology, the output of the emission approximately normally to the cleaved optical facets, improvement of distribution of emission in the near and far fields, improved temperature dependences of the output parameters. At the same time the prototype SOA has certain restrictions on the value of amplification coefficient of input emission and on the value of output amplified power together with high spatial characteristics of emission.

SUMMARY OF THE INVENTION

The technical problem of the invention was to modernize the design of the heterostructure, in particular—the leak-in region of emission and the active layer, for achievement of the technical result—the improvement of the energy and spatial characteristics of the semiconductor injection emission sources manufactured on its basis, namely—the creation of the high-power, high-efficiency and highly reliable said emission sources (including single-frequency and single-mode) with the improved frequency, speed, spectral and spatial characteristics, the decreased optical losses, lesser emission divergence angles, improved temperature dependencies of the emission power, decreased non-linear deviations of emission, as well as with the decreased ohmic and heat resistence, decreased level of the mechanical stresses and increased operational resource semiconductor injection emission sources along with the further simplification of technology of manufacturing of heterostructure.

The technical result of the invention is the further reducing of the lasing threshold currents and the increasing of the efficiency, output power and reliability of the injection laser together with high spatial characteristics of laser emission including the single-mode, single-frequency injection laser, as well as the reducing of ohmic and thermal resistances, the reducing of the level of compressive mechanical stresses, the improving of the distribution of the near and far fields of emission, the improving of the temperature dependences of output parameters, the reducing of the nonlinear distortion of emission contributing not only to obtaining high output powers, but also to decreasing of the width of a emission spectrum line, reduction of its frequency shift, the improvement of high-frequency and high-speed modulation characteristics, as well as the increasing of the operational resource along with the further simplification of technology of manufacturing of the device.

The technical result of the invention is the increasing of the sensitivity to an input signal and the increasing of the value of coefficient of small-signal amplification of the semiconductor amplifying element as well as the further reduction of the nonlinear distortion of emission for creation of high-power, high-efficiency, highly reliable, low-noise, high-frequency, high-aperture semiconductor optical amplifiers with small angles of divergence of output emission, with improved distribution of the near and far fields of emission, with reduced sensitivity to polarization of input emission, improved temperature dependences, reduced ohmic and thermal resistances, and a reduced level of mechanical stresses, as well as the increasing of operational resource of the semiconductor amplifying element along with the further simplification of technology of manufacturing of the device.

The technical result of the invention is the increasing the amplification coefficient of input emission and output power of the semiconductor optical amplifier including the single-mode, single-frequency (depending on a master source of input emission) semiconductor optical amplifier, together with high spatial characteristics of amplified emission, efficiency, reliability, with large areas of its entrance and exit apertures, reduced ohmic and thermal resistances, a reduced level of mechanical stresses, increased operational resource along with the further simplification of technology of manufacturing of the device.

One aspect of the present invention is a heterostructure based on semiconductor compounds, characterized by the ratio of the effective refractive index $n_{eff}$ of the heterostructure to the refractive index $n_{IN}$ of the leak-in layer, namely—the ratio of $n_{eff}$ to $n_{IN}$ is determined within the range from one plus delta to one minus delta, where delta is determined by a magnitude much lesser than one. The said heterostructure contains at least one active layer, at least two reflective layers, at least as one on each side of the active layer; the said reflective layers formed at least of one sublayer and have refractive indices lesser than the effective refractive index $n_{eff}$ of the heterostructure. The said heterostructure contains transparent for emission the leak-in region of emission. The leak-in region located between the active layer and a corresponding reflective layer, the leak-in region located at least on one side of the active layer, the leak-in region is at least one, the leak-in region has at least one leak-in layer having a refractive index $n_{IN}$ and consisting at least of one sublayer. The said leak-in region has at least one confining layer consisting at least of one sublayer. In this case the main adjusting layer is additionally introduced into the leak-in region, the said main adjusting layer consists at least of one sublayer and has at least for one of its sublayers a refractive index no less than the refractive index $n_{IN}$ of the leak-in layer, and adjacent with one its surface to the active layer, while on the opposite surface of the main adjusting layer there is the confining layer having a refractive index lesser than the refractive index of the main adjusting layer.

The distinction of the proposed heterostructure (HS) consists in modernization of the leak-in region and the active layer of the prototype HS, in which the design of the active layer, the location of the adjusting layer and the location of the confining layer in the leak-in region have been changed. The active layer in the proposed HS does not contain sublayers and can be at least one. In case, when one active layer is formed, the additionally introduced main adjusting layer of the leak-in region with one its side is adjacent to the active layer, while to the other side of the main adjusting layer the confining layer of the leak-in region is adjacent. In case, when two and more active layers are formed in the HS, between the active layers the main central adjusting layer is introduced having the same or close characteristics as the main adjusting layer.

The functioning of the semiconductor IES based on the proposed heterostructures occurs in the vicinity of the transient process of emission leak from the active layer and its leaking-in into the leak-in region and into part of the reflective layer adjacent to the leak-in region. This process of leak in the proposed HS is defined by the compositions and thicknesses of its layers and is controlled by the ratio of the effective refractive index $n_{eff}$ of the heterostructure to the refractive index $n_{IN}$ of the leak-in layer. A transition point of the process of leak is the provision of equality of the ratio $n_{eff}$ and $n_{IN}$ to the magnitude of 1.0. In the operating range of currents this ratio is determined within the range of magnitudes from one plus delta to one minus delta, where the magnitude of delta is about 0.01. Note that in the operating device the ratio $n_{eff}/n_{IN}$ decreases with increasing current flowing through the HS.

The efficiency of the IES at a chosen ratio $n_{eff}/n_{IN}$ and a given density of current flowing through the IES to a determining degree depends on the value of resulting amplification of emission in the active layer. It is understood that the resulting amplification is the final amplification of emission freed of resonance losses of emission in the active layer and optical losses in the HS layers.

As it was shown by calculations and confirmed by experimental data, the maximum value of the said resulting amplification in the active layer is achieved precisely by location as well as by choice of thicknesses and refractive indices of the main adjusting layers (or their sublayers). Thus the main adjusting layers, which are additionally introduced into the proposed HS, are necessary not only for controlling the ratio $n_{eff}/n_{IN}$, but they also make it possible to improve essentially both energy and spatial characteristics of the IES.

In the preferred embodiment for increase of resulting amplification of emission in the active layer and improvement of the energy characteristics of the IES at least two active layers are proposed to be introduced into the HS; in between those two active layers a introduced main central adjusting layer or one of its sublayers are placed.

For some HS, when there are restrictions on increase of the thickness of the main adjusting layer, it is advisable, along with the main adjusting layer in the leak-in region, to form an auxiliary adjusting layer adjacent to the surface of the confining layer, at least on one its side and made at least of one sublayer.

To secure effective modernization of the HS, the main adjusting layer, the main central adjusting layer and the auxiliary adjusting layer are made with refractive indices no less than the refractive index $n_{IN}$ of the leak-in layer, while the thicknesses of the said adjusting layers are chosen within the range from about 0.005 µm to about 1.0 µm.

For the effective confinement of electrons and holes in the active layer and therefore for improvement of temperature dependences and increase of efficiency of the IES the confining layer is made with a thickness chosen within the range from about 0.01 µm to about 0.30 µm.

To decrease the angular divergence of emission of the IES, the thicknesses of the leak-in layers of the leak-in region are chosen within the range from about 1.0 µm to 10 µm and more, and at least one of the sublayers of the reflective layer, for the most part adjacent to the leak-in layer, is made with a refractive index close to the refractive index of the leak-in layer.

To simplify the technological process of manufacturing, in some embodiments of the HS at least one leak-in layer is grown with a refractive index equal to the refractive index of the confining layer.

In the preferred embodiment for decrease of internal optical losses defining the efficiency of the IES made of the proposed HS, the main adjusting layer and the main central adjusting layer are not doped in growing; the auxiliary adjusting layer (if any), the leak-in layer and part of at least one reflective layer adjacent to the leak-in layer are doped with a low level of appropriate doping impurities approximately from $10^{15}$ cm$^{-3}$ to $3 \cdot 10^{17}$ cm$^{-3}$, and the confining layer is doped with a level of appropriate doping impurities approximately from $10^{17}$ cm$^{-3}$ to $2 \cdot 10^{18}$ cm$^{-3}$.

Depending on a number and location of leak-in regions or leak-in layers, two main types of HS can be manufactured: a symmetric HS and an asymmetric HS. In the symmetric HS the leak-in regions are located on each side of the active layer and for the most part have equal refractive indices and equal thicknesses of involved layers. In the asymmetric HS there could be one leak-in region located on one side of the active layer, for the most part on the side of the n-type doping.

In the preferred embodiment in the proposed HS for emission at certain wavelengths there is a possibility of selecting a composition (or a refractive index) of the leak-in layer equal or close to the composition (or the refractive index) of the semiconductor substrate, transparent for emission, on which the heterostructure is grown. Since substrates, as a rule, are binary semiconductor compounds (for example, GaAs, InP, GaN, GaSb) and the thickness of the leak-in layer usually makes the larger part of the thickness of all HS layers, then compressive mechanical stresses in the HS will be also considerably reduced, ohmic and thermal resistances will be decreased, which results in increase of efficiency, output power as well as in increase of operating life and reliability of the IES based on the proposed HS.

At the same current running through the IES, to increase the output power approximately by factor of two, three or more, in the proposed HS respectively two, three or more active layers are made, the cavities of which are parallel to each other; in between them a main central adjusting layer is placed consisting of two thin heavily doped sublayers of the p-type and the n-type which provides the tunnel passage of current from one active layer to another in operation of the IES.

The essence of the nonobvious heterostructure proposed in the present invention lays in modernization of its leak-in region and active layer; such modernization consists of main adjusting layers which are introduced into the leak-in region; also the location of the layers of the leak-in region is changed, and an active layer that does not contain sublayers is introduced. All that was made possible by an appropriate choice of thicknesses and compositions of the layers of the HS in order to attain the optimal combination of two of its major characteristics, namely—the value of resulting amplification in the active layer and the value of the ratio $n_{\mathit{eff}}/n_{IN}$ when the best power and spatial characteristics of emission of the IES are achieved.

The above described new modernized HS with all its distinctions is included in the number of the proposed in the present invention the key active elements of quantum electronic engineering: the injection laser, the semiconductor amplifying element, and the semiconductor optical amplifier.

Another aspect of the present invention is an injection laser comprising a heterostructure based on semiconductor compounds, characterized by the ratio of the effective refractive index $n_{\mathit{eff}}$ of the heterostructure to the refractive index $n_{IN}$ of the leak-in layer, namely—the ratio of $n_{\mathit{eff}}$ to $n_{IN}$ is determined within the range from one plus delta to one minus delta, where delta is determined by a magnitude much lesser than one. The said heterostructure contains at least one active layer, at least two reflective layers, at least as one on each side of the active layer; the said reflective layers formed at least of one sublayer and have refractive indices lesser than the effective refractive index $n_{\mathit{eff}}$ of the heterostructure. The said heterostructure contains transparent for emission the leak-in region of emission. The leak-in region located between the active layer and a corresponding reflective layer, the leak-in region located at least on one side of the active layer, the leak-in region is at least one, the leak-in region has at least one leak-in layer, having a refractive index $n_{IN}$ and consisting at least of one sublayer. The said leak-in region has at least one confining layer consisting at least of one sublayer. The injection laser comprise also optical facets, reflectors, ohmic contacts, an optical resonator, in which at least part of its medium is made at least of part of the leak-in region, at least of part of the active layer, and at least of part of the reflective layer. Reflection coefficients of the optical resonator reflectors as well as compositions and thicknesses of the heterostructure layers being chosen in such a way that for the said injection laser during its operation the resulting amplification of emission in the active layer becomes sufficient for upholding the lasing threshold throughout the whole range of the operating currents. In this case the main adjusting layer is additionally introduced into the leak-in region, the said main adjusting layer consists at least of one sublayer and has at least for one of its sublayers a refractive index no less than the refractive index $n_{IN}$ of the leak-in layer, and adjacent with one its surface to the active layer, while on the opposite surface of the main adjusting layer there is the confining layer having a refractive index lesser than the refractive index of the main adjusting layer. The ratio $n_{\mathit{eff}}/n_{IN}$ in the field of lasing threshold currents is determined within the range of magnitudes from one plus gamma to one minus gamma, where the magnitude of gamma is determined by a magnitude lesser than delta.

The main distinction of the proposed injection laser (hereinafter referred to as the Laser) consists in modernization of the leak-in region and the active layer of the HS, based on which the Laser is manufactured. In this case into the leak-in region main adjusting layers are introduced, the location of the layers of the leak-in region is changed. The active layer in the proposed HS does not contain sublayers and can be at least one. In the case when one active layer is formed, the additionally introduced main adjusting layer of the leak-in region with one its side is adjacent to the active layer, while to the other side of the main adjusting layer the confining layer of the leak-in region is adjacent. In the case when in the HS two and more active layers are formed, between the active layers a main central adjusting layer is placed, having the same or close characteristics as the main adjusting layer. The functioning of the Laser based on the proposed heterostructures occurs in the vicinity of the transient process of emission leak from the active layer and its leak-in into the leak-in region.

Excess leak of emission at certain values of currents can result in oscillation quenching. To avoid this, the reflection coefficients of the reflectors of the optical resonator as well as the compositions and thicknesses of the HS layers are selected so that such for the operating Laser the resulting amplification of emission in the active layer is sufficient to maintain the lasing threshold throughout the range of operating currents.

The leaking process in the laser HS is determined by the compositions and thicknesses of the HS layers and is controlled by the ratio of the effective refractive index $n_{\mathit{eff}}$ of the heterostructure to the refractive index $n_{IN}$ of the leak-in layer. A transition point of the of leaking process is the condition of equality of the ratio $n_{\mathit{eff}}$ and $n_{IN}$ to one. In the operating range of currents this ratio is chosen from the range of magnitudes from one plus delta to one minus delta, where the magnitude of delta is about 0.01. Note that in the operating device the ratio $n_{\mathit{eff}}/n_{IN}$ decreases with increasing current flowing through the HS.

To obtain low lasing threshold currents of the Laser, the ratio $n_{\mathit{eff}}/n_{IN}$ should be chosen from a narrower range of magnitudes than the said range from 1.01 to 0.99. This ratio $n_{\mathit{eff}}/n_{IN}$ in the region of initial (threshold) currents is selected in the immediate vicinity to the magnitude of one on both its sides, namely—from the range of magnitudes from one plus gamma to one minus gamma, where the magnitude of gamma determined by a value lesser than delta is about 0.005. The lasing threshold current of the Laser at a chosen value of the ratio $n_{\mathit{eff}}/n_{IN}$ to a determining degree depends on the value of resulting amplification of emission in the active layer. As shown by calculations and confirmed by experimental data for the proposed Laser, just by location as well as by choice of thicknesses and refractive indices of the main adjusting layer at a chosen ratio $n_{\mathit{eff}}/n_{IN}$ from the range from 1.005 to 0.995 the least value of lasing threshold current is achieved. Thus, the specially located main adjusting layers introduced additionally into the proposed HS are necessary not only to control the ratio $n_{\mathit{eff}}/n_{IN}$, but they also make it possible to solve the initial technical problems—first of all, to improve essentially the power parameters (threshold current, efficiency, output power) and the spatial characteristics (distribution of emission in the near field, angular divergence of emission in the far field) of the Laser.

In the preferred embodiment for decrease of lasing threshold current at least two active layers are proposed to be introduced into the HS; in between those two active layers a introduced main central adjusting layer or one of its sublayers are placed.

For some Lasers, where there are restrictions on increase of the thickness of the main adjusting layer, it is advisable, along with the main adjusting layer in the leak-in region, to form an auxiliary adjusting layer adjacent to the surface of the confining layer, at least on one its side and made at least of one sublayer.

To provide the high power parameters and spatial characteristics of the Laser, the main adjusting layer, the main central adjusting layer and the auxiliary adjusting layer are made with refractive indices no less than the refractive index $n_{IN}$ of the leak-in layer, and the thicknesses of the said adjusting layers are selected from the range of about 0.005 μm to about 1.0 μm.

For effective confinement of electrons and holes in the active layer and therefore for the improvement of temperature dependences and increase of efficiency of the Lasers the confining layer is made with a thickness selected within the range from about 0.01 μm to about 0.30 μm.

To decrease the angular divergence of emission in the vertical plane and to increase the efficiency of the Laser, the thicknesses of the leak-in layers of the leak-in region are selected within the range from about 1.0 μm to about 10 μm and more; also, at least one of the sublayers of the reflective layer, for the most part adjacent to the leak-in layer, is made with a refractive index close to the refractive index of the leak-in layer.

To simplify the technological process of manufacturing, in some embodiments of the Laser at least one leak-in layer is made with a refractive index equal to the refractive index of the confining layer.

In the preferred embodiment for decrease of internal optical losses defining the efficiency of the Lasers the main adjusting layer and the main central adjusting layer are not doped in growing; the auxiliary adjusting layer (if any), the leak-in layer and part of at least one reflective layer adjacent to the leak-in layer are doped with a low level of appropriate doping impurities approximately from $10^{15}$ cm$^{-3}$ to $3 \cdot 10^{17}$ cm$^{-3}$, and the confining layer is doped with a level of appropriate doping impurities approximately from $10^{17}$ cm$^{-3}$ to $3 \cdot 10^{18}$ cm$^{-3}$.

Depending on a number and location of leak-in regions (or leak-in layers), two main types of Lasers can be manufactured: a symmetric Laser and an asymmetric Laser. In the symmetric Laser the leak-in regions are located on each side of the active layer and for the most part have equal refractive indices and equal thicknesses of involved layers. In the asymmetric Laser the leak-in region can be one, being located on one side of the active layer, for the most part on the side of the n-type doping.

In the preferred embodiment in the proposed Laser at certain wavelengths there is a possibility of choosing a composition (or a refractive index) of the leak-in layer equal or close to the composition (or the refractive index) of the semiconductor substrate (on which the heterostructure is grown) which is transparent for emission. Since substrates, as a rule, are binary semiconductor compounds (for example, GaAs, InP, GaN, GaSb), and the thickness of the leak-in layer usually makes the larger part of the thickness of all HS layers. In this case the level of compressive mechanical stresses will be considerably reduced, ohmic and thermal resistances will be decreased, which results in increase of efficiency, output power as well as in increase of operating life and reliability of the proposed Lasers.

At the same operating current, to increase output power approximately by factor of two, three and more, in the proposed Laser respectively two, three and more active layers are made, the cavities of which are parallel to each other, and between them a main central adjusting layer is placed consisting of two thin heavily doped sublayers of the p-type and the n-type which in operational Laser provide the tunnel passage of current from one active layer to another.

It should be noted that in the proposed Laser nonlinear distortion contributing to the spatial instability of a laser beam and resulting in limitation of output power in the high-power injection lasers is considerably reduced [P. G. Eliseev, Yu. M. Popov, Kvantovaya elektronika, 24, No. 12 (1997), 1067-1079]. This is caused by the fact that in the proposed Laser most of the flux of laser emission (about 99.99%) is propagated through the transparent leak-in layer (a linear medium), and a very small part of the flux (about 0.01% and less) is propagated through a nonlinear active medium. This determines obtaining high output powers including single-frequency lasing as well as decrease of the width of a spectrum line, reduction of its frequency shift, improvement of the high-frequency and high-speed modulation characteristics of the proposed Lasers, which is of great practical importance in their use in modern fiber links and other applications.

The essence of the non-obvious Laser proposed in the present invention consists in modernization of the leak-in region and the active layer of the HS, based on which the Laser is made. In this case additional originally located main adjusting layers adjacent to the surface of the active layer not containing sublayers are introduced into the leak-in region, and other original characteristics (location, compositions, thicknesses, levels of doping) of the main and auxiliary adjusting layers, the confining layers, the leak-in layers and their sublayers, the reflective layers and their sublayers are proposed, which has made it possible by appropriate choice of thicknesses and compositions of the layers of the HS to realize the optimum combination of two its major characteristics—the resulting amplification in the active layer and the ratio $n_{eff}/n_{IN}$ in the field of initial (threshold) currents, at which the best energy and spatial characteristics of the Laser are achieved.

Another aspect of the present invention is a semiconductor amplifying element (hereinafter referred to as the SAE) comprising a heterostructure based on semiconductor compounds, characterized by the ratio of the effective refractive index $n_{eff}$ of the heterostructure to the refractive index $n_{IN}$ of the leak-in layer, namely—the ratio of $n_{eff}$ to $n_{IN}$ is determined within the range from one plus delta to one minus delta, where delta is determined by a magnitude much lesser than one. The said heterostructure contains at least one active layer, at least two reflective layers, at least as one on each side of the active layer; the said reflective layers formed at least of one sublayer and have refractive indices lesser than the effective refractive index $n_{eff}$ of the heterostructure. The said heterostructure contains transparent for emission the leak-in region where the emission leaks-in. The leak-in region located between the active layer and a corresponding reflective layer, the leak-in region located at least on one side of the active layer, the leak-in region is at least one, the leak-in region has at least one leak-in layer, having a refractive index $n_{IN}$ and consisting at least of one sublayer. The said leak-in region has at least one confining layer consisting at least of one sublayer. The SAE comprises also optical facets, ohmic contacts and the clarifying film at least on one optical facet. The reflection coefficients of the clarifying films on the optical facets as well as the compositions and thicknesses of the heterostructure layers being chosen in such a way that the value of resulting amplification of emission in the active layer throughout the whole range of the operating currents does not exceed the value of the said amplification bringing to the self-excitation of the operating semiconductor amplifying element, in which the medium of propagation of the amplified emission is at least part of the leak-in region, at least part of the active layer, and at least part of the reflective layer adjacent to the leak-in layer. In this case the main adjusting layer is additionally introduced into the leak-in region, the said main adjusting layer consists at least of one sublayer and has at least for one of its sublayers a refractive index no less than the refractive index $n_{IN}$ of the leak-in layer, and adjacent with one its surface to the active layer, while on the opposite surface of the main adjusting layer there is the confining layer having a refractive index lesser than the refractive index of the main adjusting layer.

The main distinction of the proposed SAE consists in modernization of the leak-in region and the active layer of the HS, based on which the SAE is manufactured. In this case into the leak-in region main adjusting layers are introduced, the location of the layers of the leak-in region is also changed. The active layer in the proposed HS does not contain sublayers and can be at least a single one. In case when one active layer is formed, the additionally introduced main adjusting layer of the leak-in region with one its side is adjacent to the active layer, while to the other side of the main adjusting layer the confining layer of the leak-in region is adjacent. In case when two and more active layers are formed, between the active layers an introduced main central adjusting layer is placed, having the same or close characteristics as the main adjusting layer. The functioning of the SAE based on the proposed heterostructures occurs in the vicinity of the transient process of emission leak from the active layer and its leak-in into the leak-in region.

The process of leaking in the SAE is defined by the compositions and thicknesses of the HS layers and is controlled by the ratio of the effective refractive index $n_{eff}$ of the heterostructure to the refractive index $n_{IN}$ of the leak-in layer. In the field of operating currents the ratio of $n_{eff}$ to $n_{IN}$ is determined from the range from about 1.01 to about 0.99.

The sensitivity of the SAE to an input signal as well as the level of noise, amplification coefficient, output power for a given operating current and at a chosen value of the ratio $n_{eff}/n_{IN}$ to a determining degree depends on the value of resulting amplification of emission in the active layer. As shown by calculations for the proposed SAE, at a chosen ratio $n_{eff}/n_{IN}$ precisely by location as well as by choice of thicknesses and refractive indices of the main adjusting layer (or its sublayers) the maximum value of the said resulting amplification at a certain operating current is achieved. Thus the originally located main adjusting layers introduced additionally into the proposed HS make it possible to solve the technical problem, namely—to improve essentially the main parameters of the SAE: the sensitivity to an input signal, the level of noise, amplification coefficient, output power, as well as to increase the sizes of the entrance and exit apertures, to reduce polarization sensitivity and the angular divergence of emission in the far field.

To stabilize the amplification mode of the SAE, the reflection coefficients of the clarifying films on the optical facets as well as the compositions and thicknesses of the heterostructure layers are chosen in such a way that the value of resulting emission amplification in the active layer at an operating current does not exceed the value of the said amplification leading to the self-excitation of the operating semiconductor amplifying element.

In the preferred embodiment for increase of sensitivity to an input signal and increase of amplification coefficient at least two active layers are proposed to be introduced into the HS; in between those two active layers a introduced main central adjusting layer or one of its sublayers are placed.

For some SAE, in which there are restrictions on increase of the thickness of the main adjusting layer, it is advisable, along with the main adjusting layer in the leak-in region, to form an auxiliary adjusting layer adjacent to the surface of the confining layer, at least on one its side and made at least of one sublayer.

To optimize the main parameters of the SAE, the main adjusting layer, the main central adjusting layer and the auxiliary adjusting layer are made with refractive indices no less than the refractive index $n_{IN}$ of the leak-in layer, and the thicknesses of the said adjusting layers are chosen within the range from about 0.005 μm to about 1.0 μm.

To improve the temperature dependences of the SAE parameters, the confining layer is made with a thickness chosen within the range from about 0.01 μm to about 0.30 μm.

To reduce the noise factors and to decrease the angular divergence of amplified emission of the SAE, the thicknesses of the leak-in layers of the leak-in region are chosen within the range from about 1.0 μm to about 10 μm and more, and at least one of the sublayers of the reflective layer, preferably adjacent to the leak-in layer, is made with a refractive index close to the refractive index of the leak-in layer.

To simplify the technological process of manufacturing, in some embodiments of the SAE at least one leak-in layer of the leak-in region is made with a refractive index equal to the refractive index of the confining layer.

In the preferred embodiment for decrease of internal optical losses defining the efficiency of the SAE the main adjusting layer and the main central adjusting layer are not doped in the process of growing, the auxiliary adjusting layer (if any), the leak-in layer and part of at least one reflective layer adjacent to the leak-in layer are doped with a low level of appropriate doping impurities approximately from $10^{15}$ cm$^{-3}$ to $3 \cdot 10^{17}$ cm$^{-3}$, and the confining layer is doped with a level of appropriate doping impurities approximately from $10^{17}$ cm$^{-3}$ to $3 \cdot 10^{18}$ cm$^{-3}$.

Depending on a number and location of leak-in regions (or leak-in layers), two main types of SAE can be manufactured—a symmetric SAE and an asymmetric SAE. In the symmetric SAE the leak-in regions are located on each side of the active layer and for the most part have equal refractive indices and equal thicknesses of involved layers. In the asymmetric SAE there can be one leak-in region located on one side of the active layer, for the most part on the side of the n-type of doping.

In the preferred embodiment in the proposed SAE at certain wavelengths there is a possibility of choosing a composition (or a refractive index) of the leak-in layer identical or close to the composition (or the refractive index) of the semiconductor substrate which is transparent for emission and on which the heterostructure is grown. Since substrates, as a rule, are binary semiconductor compounds (for example, GaAs, InP, GaN, GaSb), and the thickness of the leak-in layer usually makes the larger part of the thickness of all HS layers, then the level of compressive mechanical stresses will be considerably reduced, ohmic and thermal resistances will be decreased, which results in increase of efficiency, output power as well as in increase of operating life and reliability of the proposed SAE.

At the same operating current, to increase the output power of amplified emission approximately by factor of two, three and more, in the proposed SAE respectively two, three and more active layers are made, the cavities of which are parallel to each other, and between each adjacent active layers a main central adjusting layer is placed consisting of two thin heavily doped sublayers of the p-type and the n-type providing in the operating SAE the tunnel passage of current from one active layer to another.

To obtain the polarization insensitivity of the SAE, the leak-in layer of the leak-in region is made with a thickness approximately equal to the width of the introduced stripe (or mesa stripe) region of current flow.

In the proposed SAE additional reduction of requirements to clarifying films can be obtained if the stripe region of current flow is made inclined at an appropriate angle to the cavity of the optical facet.

For individual embodiments of the proposed SAE the entrance and exit apertures are formed matching to the aperture of an optical fiber. In this case for input of an input signal and for output of amplified emission the opposite optical facets of the SAE (with the clarifying films applied to them) are optically coupled with optical fibers not only with the use of optical coupling elements, but also directly in immediate contact with optical fibers. The decrease of losses of input emission in its input results in reduction of the noise factor of the SAE.

The essence of the new non-obvious SAE with the leaking emission proposed in the present invention consists in modernization of the leak-in region and the active layer of the HS, in which additional originally located main adjusting layers adjacent to the active layer are introduced into the leak-in region, as well as other original characteristics (location, compositions, thicknesses, levels of doping) of the main and auxiliary adjusting layers, the confining layers, the leak-in layers and their sublayers, the reflective layers and their sublayers are proposed, which has made it possible to improve considerably the major characteristics of the SAE, in particular—to increase the sensitivity to an input signal, efficiency, output power, to decrease the angular divergence of amplified emission, to reduce the optical losses of emission at the input and output, to reduce the level of noise, to increase the operating life and reliability together with simplification of the alignment technology.

Another aspect of the present invention is a semiconductor optical amplifier (hereinafter referred to as the SOA) is proposed including optically coupled master source of input emission and semiconductor amplifying element comprising a heterostructure based on semiconductor compounds, characterized by the ratio of the effective refractive index $n_{eff}$ of the heterostructure to the refractive index $n_{IN}$ of the leak-in layer, namely—the ratio of $n_{eff}$ to $n_{IN}$ is determined within the range from one plus delta to one minus delta, where delta is determined by a magnitude much lesser than one. The said heterostructure contains at least one active layer, at least two reflective layers, at least as one on each side of the active layer; the reflective layers formed at least of one sublayer and have refractive indices lesser than the effective refractive index $n_{eff}$ of the heterostructure. The said heterostructure contains transparent for emission the leak-in region of emission. The leak-in region located between the active layer and a corresponding reflective layer, the leak-in region located at least on one side of the active layer, the leak-in region is at least one, the leak-in region has at least one leak-in layer, having a refractive index $n_{IN}$ and consisting at least of one sublayer. The said leak-in region has at least one confining layer consisting at least of one sublayer. The SAE incorporated in the SOA comprises also optical facets, ohmic contacts and the clarifying film at least on one optical facet. The reflection coefficients of the clarifying films on the optical facets as well as the compositions and thicknesses of the heterostructure layers being chosen in such a way that the value of resulting amplification of emission in the said active layer throughout the whole range of the operating currents does not exceed the value of the said amplification bringing to the self-excitation of the operating semiconductor amplifying element, in which the medium of propagation of the amplified emission is at least part of the leak-in region, at least part of the active layer, and at least part of the reflective layer adjacent to the leak-in layer. In this case the main adjusting layer is additionally introduced into the leak-in region; the said main adjusting layer consists at least of one sublayer and has at least for one of its sublayers a refractive index no less than the refractive index $n_{IN}$ of the leak-in layer and adjacent with one its surface to the active layer, while on the opposite surface of the main adjusting layer there is the confining layer having a refractive index lesser than the refractive index of the main adjusting layer.

The proposed SOA is based on the modernized SAE, the main distinction of which consists in modernization of the leak-in region and the active layer of the HS, based on which the SAE is manufactured. In this case into the leak-in region main adjusting layers are introduced, the location of the layers of the leak-in region is changed. The active layer in the proposed HS does not contain sublayers and can be at least one. In the case when one active layer is formed, the additionally introduced main adjusting layer of the leak-in region with one its side is adjacent to the active layer, while to the other side of the main adjusting layer the confining layer of the leak-in region is adjacent. In the case when two and more active layers are formed, between the active layers an introduced main central adjusting layer is placed, having the same or close characteristics as the main adjusting layer. The functioning of the SOA with the SAE involved occurs in the vicinity of the transient process of emission leak from the active layer and its leak-in into the leak-in region.

The process of leak is defined by the compositions and thicknesses of the HS layers and is controlled by the ratio of the effective refractive index $n_{eff}$ of the heterostructure to the refractive index $n_{IN}$ of the leak-in layer. In the operating range of currents this ratio of $n_{eff}$ to $n_{IN}$ is determined within the range from one plus delta to one minus delta, namely—from about 1.01 to about 0.99.

Amplification coefficient, output power as well as the level of noise, the sensitivity of the proposed SOA to an input signal at a chosen value of the ratio $n_{eff}/n_{IN}$ to a determining degree depend on the value of resulting amplification of emission in the active layer of the SAE HS for a given operating current. As shown by calculations for the proposed SOA, just by location as well as by choice of thicknesses and refractive indices of the main adjusting layer (or its sublayers) the most value of the said resulting amplification is achieved. Thus the originally located main adjusting layers introduced additionally into the proposed HS make it possible to solve the technical problem, first of all to improve essentially the said parameters of the SOA as well as to increase the sizes of the entrance and exit apertures, to reduce polarization sensitivity and to decrease the angular divergence of emission in the far field.

To stabilize the amplification mode of the SOA, the reflection coefficients of the clarifying films on the optical facets of the SAE as well as the compositions and thicknesses of the heterostructure layers are chosen in such a way that the value of resulting amplification of emission in the active layer at an operating current does not exceed the value of the said amplification leading to the self-excitation of the operating SOA.

In the preferred embodiment for increase of sensitivity to an input signal and increase of amplification coefficient of the SOA at least two active layers are proposed to be introduced into the SAE HS; in between those two active layers a introduced main central adjusting layer or one of its sublayers are placed.

For some SOA, in which there are restrictions on increase of the thickness of the main adjusting layer of the SAE HS, it is advisable, along with the main adjusting layer in the leak-in region, to form an auxiliary adjusting layer adjacent to the surface of the confining layer, at least on one its side and made at least of one sublayer.

To optimize the main parameters of the SOA, the main adjusting layer, the main central adjusting layer and the auxiliary adjusting layer of the SAE HS are made with refractive indices no less than the refractive index $n_{IN}$ of the leak-in layer, and the thicknesses of the said adjusting layers are chosen from the range from about 0.005 μm to about 1.0 μm.

To improve the temperature dependences of the SOA parameters, the confining layer of the SAE HS is made with a thickness chosen from the range from about 0.01 μm to about 0.30 μm.

To reduce the noise factors and to decrease the angular divergence of amplified emission of the SOA, the thicknesses of the leak-in layers of the leak-in region of the SAE HS are chosen from the range from about 1.0 μm to about 10 μm and more, and at least one of the sublayers of the reflective layer, for the most part adjacent to the leak-in layer, is made with a refractive index close to the refractive index of the leak-in layer.

To simplify the technological process of manufacturing, in some embodiments of the SOA at least one leak-in layer of the leak-in region of the SAE HS is made with a refractive index equal to the refractive index of the confining layer.

In the preferred embodiment for decrease of internal optical losses defining the efficiency of the SOA the main adjusting layer and the main central adjusting layer of the SAE HS are not doped in growing, the auxiliary adjusting layer (if any), the leak-in layer and part of at least one reflective layer of the SAE HS adjacent to the leak-in layer are doped with a low level of appropriate doping impurities approximately from $10^{15}$ cm$^{-3}$ to $3 \cdot 10^{17}$ cm$^{-3}$, and the confining layer of the SAE HS is doped with a level of appropriate doping impurities approximately from $10^{17}$ cm$^{-3}$ to $3 \cdot 10^{18}$ cm$^{-3}$.

Depending on a number and location of leak-in regions (or leak-in layers), two main types of SOA can be manufactured, a symmetric SOA and an asymmetric SOA. In the SAE involved in the symmetric SOA the leak-in regions are located on each side of the active layer and for the most part have equal refractive indices and equal thicknesses of involved layers. In the SAE involved in the asymmetric SOA the leak-in region can be one, being located on one side of the active layer, for the most part on the side of the n-type of doping.

In the preferred embodiment in the proposed SOA at certain lasing wavelengths there is a possibility of choosing a composition (or a refractive index) of the leak-in layer of the SAE HS identical or close to the composition (or the refractive index) of the semiconductor substrate, transparent for emission, on which the heterostructure is grown. Since substrates, as a rule, are binary semiconductor compounds (for example, GaAs, InP, GaN, GaSb), and the thickness of the leak-in layer usually makes the most part of the thickness of all HS layers, in this case the level of compressive mechanical stresses will be considerably reduced, ohmic and thermal resistances will be decreased, which results in increase of efficiency, output power as well as in increase of operating life and reliability of the proposed SOA.

At the same operating current, to increase the output power of amplified emission approximately by factor of two, three and more, in the proposed SOA respectively two, three and more active layers of the SAE HS are made, the cavities of which are parallel to each other, and between each adjacent active layers a main central adjusting layer of the SAE HS is placed consisting of two thin heavily doped sublayers of the p-type and the n-type providing the tunnel passage of current from one active layer to another in the operating SOA.

To obtain the polarization insensitivity of the SOA, the leak-in layer of the leak-in region of the SAE HS is made with a thickness approximately equal to the width of the introduced stripe region of current flow.

In the proposed SOA for additional reduction of requirements to clarifying films the stripe (or mesa stripe) region of current flow of the SAE is made inclined at an appropriate angle to the cavity of the optical facet.

For individual embodiments of the proposed SOA the entrance and exit apertures of the SAE are formed matched to the aperture of an optical fiber. In this case for input of an input signal and output of amplified emission the opposite optical facets of the SAE with the clarifying films applied to them are optically coupled with optical fibers not only with the use of the known optical coupling elements, but also directly in immediate contact with the SAE. The decrease of losses of input emission in its input into the fiber results in increase of efficiency of the SOA.

In the preferred embodiment for obtaining high-quality amplified emission at the SOA output the master source of input emission is made as an injection laser. To increase the efficiency and output power of the SOA, the master injection laser is preferably chosen as the Laser proposed in the present invention and considered above on pp. 9-13. For this embodiment of the SOA the efficient optical coupling of the master Laser and the SAE can be obtained in immediate contact between them without the use of optical coupling elements. In this case the SOA embodiment is preferable in which the master Laser and the SAE are made of the same heterostructure. The embodiments of high-power SOA are also possible, in which the width of the introduced stripe region of current flow of the SAE is chosen more than the width of the introduced stripe region of the master Laser, or when the width of the stripe region of current flow of the SAE is made widenable.

It should be noted that the presence of leaky emission in the master Laser and the SAE involved in the SOA results in significant decrease of internal optical losses (leading to increase of efficiency of the SAE) and to reduction of nonlinear distortion contributing to the spatial instability of amplified emission and resulting in limitation of output power in the high-power SOA. This is caused by the fact that in the proposed SOA the major part of amplified emission (about 99.9% and more) is propagated through the transparent leak-in layer (a linear medium), and a very small part of the flux (about 0.1% and less) is propagated through a nonlinear active medium. This determines not only obtaining high output powers of emission, but also decrease of the width of a spectrum line of emission, reduction of its frequency shift, improvement of the high-frequency and high-speed modulation characteristics of the SOA.

The essence of the new non-obvious SOA proposed in the present invention and the included in it master source of input emission (the master Laser) and the SAE consists in modernization of the leak-in region and the active layer of the heterostructures of the master Laser and the SAE, in which additional originally located main adjusting layers adjacent to the active layer are introduced into the leak-in region, and other original characteristics (location, compositions, thicknesses, levels of doping) of the main and auxiliary adjusting layers, the confining layers, the leak-in layers and their sublayers, the reflective layers and their sublayers are proposed, which has made it possible to improve essentially the major characteristics of the SOA: efficiency, output power, the angular divergence of amplified emission, optical losses at the input and output, the operating life and reliability together with simplification of the alignment technology.

The technological realization of the HS, Lasers, SAE, SOA proposed in the present invention is based on the known base technological processes that by now are well developed and widely used. The proposal satisfies the criterion "industrial applicability". The main distinction in their manufacturing consists in other compositions, thicknesses and location of the grown layers of the laser heterostructure.

BRIEF DESCRIPTION OF THE DRAWINGS

The present invention will be described in detail below in connection with FIGS. 1 . . . 10, where.

DETAILED DESCRIPTION OF PREFERRED EMBODIMENTS

Hereinafter the invention is explained by the description of concrete embodiments with references to the enclosed drawings. The given examples of the embodiments of the HS, Laser, SAE, and SOA are not the only ones and assume the availability of other realizations, including the known wavelength ranges, the features of which are reflected in the sum of the distinctions according to the claim.

The proposed heterostructure 1 (see FIG. 1) contains one active layer 2, on each side of which two leak-in regions 3 and 4 were adjacent. To the leak-in regions 3 and 4 on each external (relative to the active layer 2) side two reflective layers 5 and 6 were adjacent. The reflective layer 6 is located on the side of the substrate 7 of the n-type GaAs. The leak-in regions 3 and 4 each contains one main adjusting layer 8 and 9 adjacent to the active layer 2 on each of its side, each one of confining layers 10 and 11 adjacent respectively to the main adjusting layers 8 and 9, and each one of leak-in layers 12 and 13 adjacent respectively to the confining layers 10 and 11. The active layer 2 is made of InGaAs with a thickness of 0.008 µm. The laser wavelength in such a heterostructure 1 is equal to 980 nm. The main adjusting layers 8 and 9 had the same thicknesses of 0.04 µm and were grown of GaAs. The confining layers 10 and 11 had the same compositions of $Al_{0.38}Ga_{0.62}As$ and the same thicknesses of 0.04 µm. The leak-in layers 12 and 13 had the same thicknesses of 4.0 µm and were grown of $Al_{0.19}Ga_{0.81}As$. Both reflective layers 5 and 6 consisted of two sublayers of the same compositions and thicknesses. The first sublayers 14, 15 with a thickness of 0.5 µm adjacent to corresponding leak-in layers were grown of $Al_{0.20}Ga_{0.80}As$, the composition close to the composition of the leak-in layer; the second sublayers 16, 17 with a thickness of 0.6 µm were grown of $Al_{0.25}Ga_{0.75}As$. Let us note that hereinafter to each composition of semiconductor layers for a fixed emission wavelength there is a certain corresponding refractive index. When growing the HS 1, the active layer 2 and the main adjusting layers 8 and 9 were not doped, the confining layers 10 (of the p-type) and 11 (of the n-type) were doped with the known impurities to $6 \cdot 10^{17}$ $cm^{-3}$ and $3 \cdot 10^{17}$ $cm^{-3}$ respectively, the leak-in layers 12, 13 and the first sublayers 14, 16 of the reflective layers 5 and 6 of the p-type and the n-type respectively were doped to $1 \cdot 10^{17}$ $Cm^{-3}$, and the second sublayers 15, 17 of the reflective layers 5 and 6 of the p-type and the n-type respectively were doped to $2 \cdot 10^{18}$ $cm^{-3}$.

Figure 1:
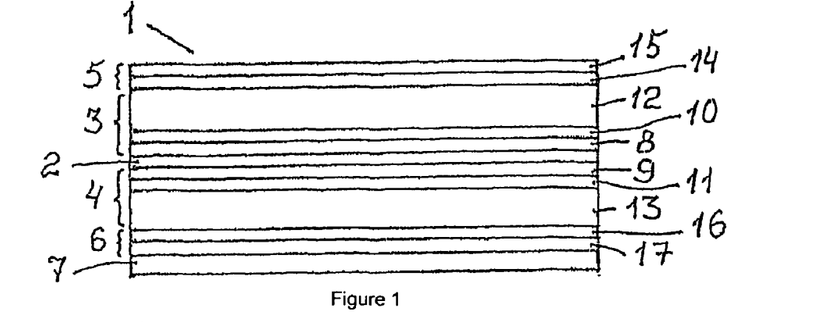
FIG. 1 is a schematic illustration of the section of the proposed symmetric HS with one active layer, two main adjusting layers and two identical leak-in layers located on each side of the active layer.

The chosen compositions and thicknesses of the HS 1 layers provided at current densities of 0.3 kA/cm² and 10 kA/cm² calculated values of the ratios $n_{eff}$ to $n_{IN}$ of 1.000006 and 0.99964 respectively. The resulting amplification in the active layer at a current density of 0.35 kA/cm² was 7.8 cm⁻¹. The calculated angle of divergence $\theta\perp$ in the vertical plane at a current density of 10 kA/cm² was 6.0° (hereinafter FWHM).

The following embodiment of the HS 1 differed from the above one that in this embodiment the thicknesses of the leak-in layers 12 and 13 were identical and equal to 2.5 µm. In this case the calculated values of the ratios $n_{eff}$ to $n_{IN}$ at current densities of 0.3 kA/cm² and 10 kA/cm² were respectively 0.99992 and 0.99933. The resulting amplification at a current density of 0.3 kA/cm² was 10.0 cm⁻¹. The calculated angle of divergence $\theta\perp$ in the vertical plane at a current density of 10 kA/cm² was 9.0°.

The following embodiment of the HS 1 (see FIG. 2) differed from the embodiment schematically presented in FIG. 1 in that in this embodiment the leak-in layers 12 and 13 were grown of $Al_{0.05}Ga_{0.95}As$, and into the leak-in region, together with the main adjusting layers 8 and 9, two auxiliary adjusting layers 18 and 19 were introduced additionally that were made of GaAs and located on each side of the active layer between the confining layers 10 and 11 and the leak-in layers 12 and 13. The obtained HS 1 due to the low content of Al in the layers 12, 13 and 5, 6 had reduced ohmic and thermal resistances and compressive mechanical stresses.

The following embodiment of the HS 1 (see FIG. 3) differed from the embodiment schematically presented in FIG. 1 in that in this embodiment the thicknesses of the leak-in layers 12 and 13 were respectively 0.5 µm and 7.0 µm, and the thickness of the main adjusting layer 8 was 0.06 µm. For this embodiment of the HS1 the calculated magnitudes of the ratios $n_{\it eff}$ to $n_{IN}$ at current densities of 0.3 kA/cm² and 10 kA/cm² were respectively 1.00004 and 0.99984. The resulting amplification at a current density of 0.3 kA/cm² was 10.2 cm$^{-1}$. The calculated angle of divergence θ⊥ in the vertical plane at a current density of 10 kA/cm² was 8.1°.

The following embodiment of the HS 1 (see FIG. 4) differed from the above in that in this embodiment two identical active layers 2 were formed, the main central adjusting layer 20 of GaAs with a thickness of 0.012 µm located between the active layers was introduced, and the thickness of the main adjusting layer 8 was 0.03 µm. For this embodiment of the HS 1 the calculated values of the ratios $n_{\it eff}$ to $n_{IN}$ at current densities of 0.3 kA/cm² and 10 kA/cm² were respectively 1.00002 and 0.99984. The resulting amplification at a current density of 0.3 kA/cm² was 8.9 cm$^{-1}$. The calculated angle of divergence at in the vertical plane at a current density of 10 kA/cm² was 8.1°.

Figure 4:
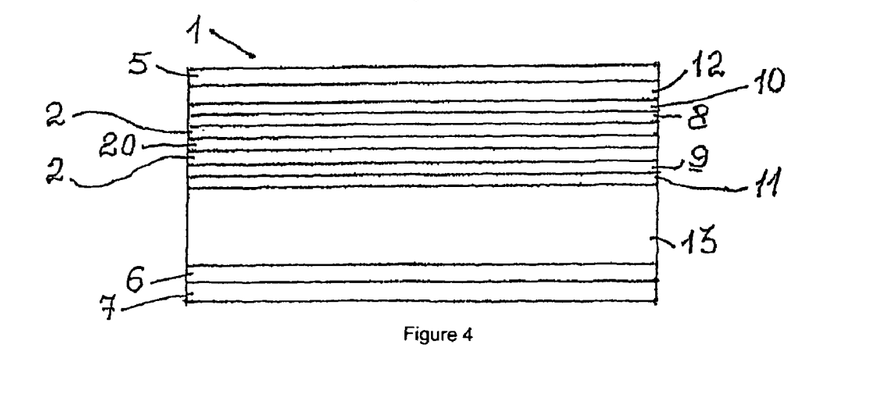
FIG. 4 is a schematic illustration of the section of the proposed asymmetric HS with two active layers, two main adjusting layers, one main central adjusting layer and two leak-in layers of different thicknesses.

The following embodiment of the HS 1 differed from the embodiment schematically presented in FIG. 4 in that in this embodiment the main central adjusting layer 20 consisted of two thin (each with a thickness of 0.005 µm) sublayers of the n-type and the p-type, doped respectively with tellurium and carbon to concentrations of $5 \cdot 10^{19}$ cm$^{-3}$. The sublayer of the n-type was placed on the side of the reflective layer of the p-type, and the sublayer of the p-type was placed on the side of the reflective layer of the n-type and the substrate of the n-type.

The following embodiment of the HS 1 differed from the embodiment schematically presented in FIG. 1 in that in this embodiment the leak-in layers 12 and 13 were made with the same composition (and therefore with the same refractive index) as the confining layers 11 and 10, namely, of $Al_{0.38}Ga_{0.62}As$, and the reflective layers 5 and 6 (without sublayers) had the composition $Al_{0.45}Ga_{0.55}As$. This embodiment of the HS 1, as compared with the previous ones, contained a lesser number of layers, however, it was characterized by increased values of ohmic resistances, thermal resistances and compressive mechanical stresses.

Figure 5:
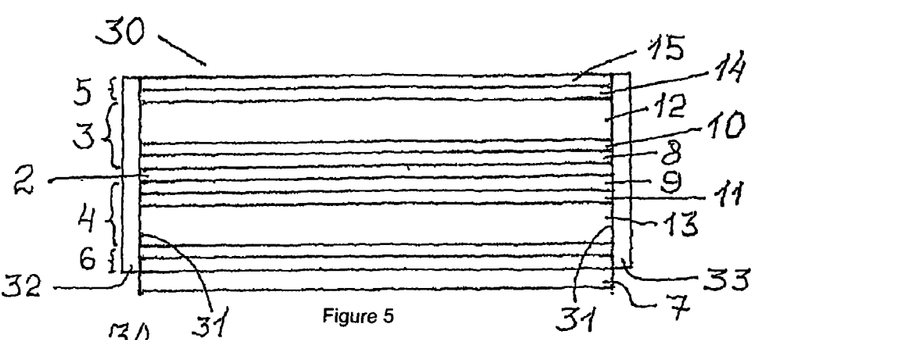
FIG. 5 is a schematic illustration of the longitudinal section of the proposed symmetric Laser with reflective coatings on the optical facets, with one active layer, two main adjusting layers and two identical leak-in layers located on each side of the active layer.

The proposed Laser 30 (see FIG. 5) was made with the use of the embodiment of the symmetric HS 1 presented in FIG. 1. To the substrate 7 of the n-type and the contact layer of the p-type formed on the opposite side (not shown in the Figures) the metallization layers (not shown in the Figures) were applied. The length of the optical resonator $L_{res}$ was chosen equal to 2000 µm. To the cleaved facets 31 the reflective coatings 32 and 33 with reflection coefficients respectively $R_1$=99% and $R_2$=5% were applied. The stripe regions of current flow had a mesa stripe width of 10 µm. The calculated threshold current density $j_{thr}$ was 350 A/cm², and the differential efficiency $\eta_d$ was about 88%. At all values of over-threshold current, up to 20 kA/cm², the resulting amplification in the active layer was more than at $j_{thr}$. The angle of leak φ in this case varied from 0° to 1.65°, which provided the single-mode (in the vertical plane) operation of the Laser 30 in the range from 0.35 kA/cm² to 20 kA/cm². The known calculated confinement factor Γ defining a share of laser emission propagating in the active layer 2 at a current density of 10 kA/cm² was $3 \cdot 10^{-4}$. The calculated angle of divergence θ⊥ in the vertical plane decreased from 7.8° (at a current density of 0.35 kA/cm²) to 6.0° (at 10 kA/cm²). The size of the emitting area at a level of 0.13 on the output optical facet of the resonator in the vertical plane varied from 5.7 µm (at 0.35 kA/cm²) to 8.0 µm (at 10 kA/cm²).

Figure 2:
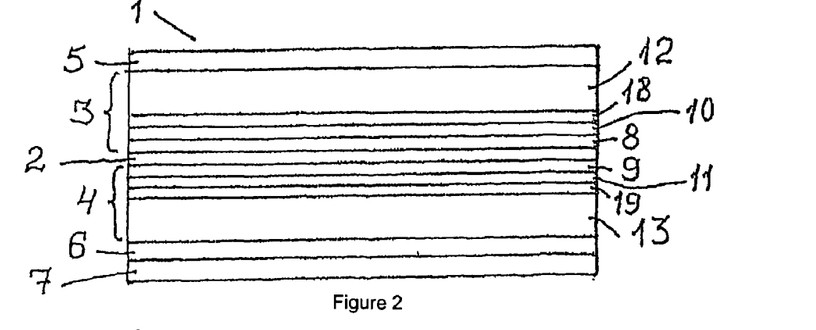
FIG. 2 is a schematic illustration of the section of the proposed symmetric HS with one active layer, two main and two auxiliary adjusting layers.
Figure 6:
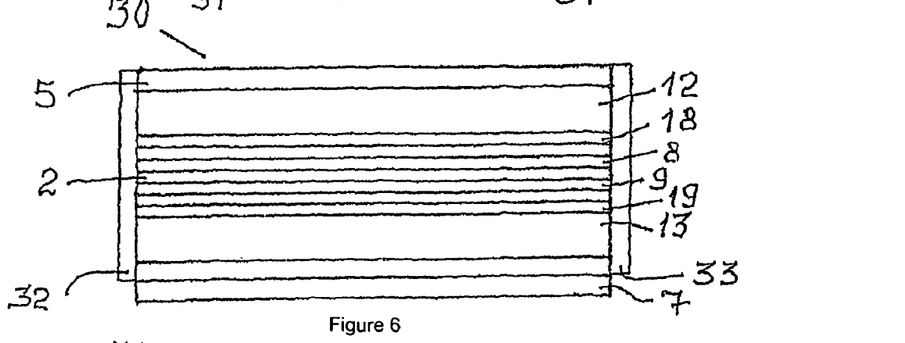
FIG. 6 is a schematic illustration of the longitudinal section of the proposed symmetric Laser with reflective coatings on the optical facets, with one active layer, two main and two auxiliary adjusting layers.

The proposed Laser 30 (see FIG. 6) was made with the use of the embodiment of the symmetric HS 1 presented in FIG. 2, in which the leak-in layers 12 and 13 as well as the first sublayers 14 and 16 of the reflective layers 5, 6 were made with the a low content of Al of $Al_{0.05}Ga_{0.95}As$ and of $Al_{0.06}Ga_{0.94}As$, respectively. In this case the auxiliary adjusting layers 18 and 19 were made of GaAs with equal thicknesses of 0.24 µm. This embodiment of the Laser 30 had increased efficiency, power and reliability of operation.

Figure 3:
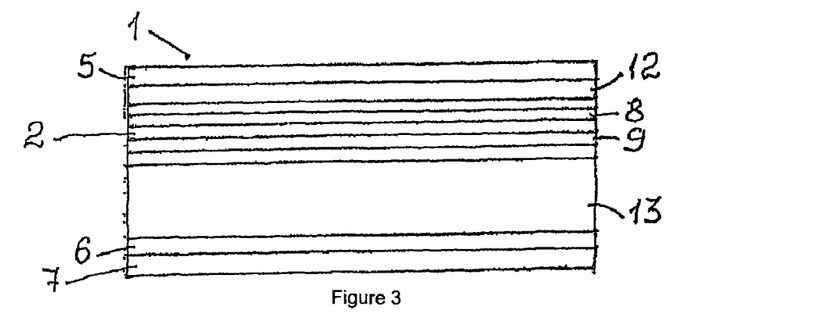
FIG. 3 is a schematic illustration of the section of the proposed asymmetric HS with one active layer, two main adjusting layers and two leak-in layers of different thicknesses located on each side of the active layer.

The proposed Laser 30 (see FIG. 7) was made with the use of the embodiment of the asymmetric HS 1 presented in FIG. 3, in which the leak-in layers 12 and 13, identical in composition, had thicknesses respectively of 0.5 and 7.0 µm. By choosing thicknesses of the main adjusting layers 8 and 9 a threshold current density of 0.3 kA/cm² was achieved. The calculated angle of divergence θ⊥ in the vertical plane at first decreased from 7.5° (at a current density of 0.3 kA/cm²) to 7.2° (at 3 kA/cm²) and then increased to 8.1° (at 10 kA/cm²). In this case the size of the emitting area (at a level of 0.13) on the output optical facet of the resonator in the vertical plane at first increased from 4.6 µm to 7.2 µm and then decreased to 6.0 µm.

Figure 7:
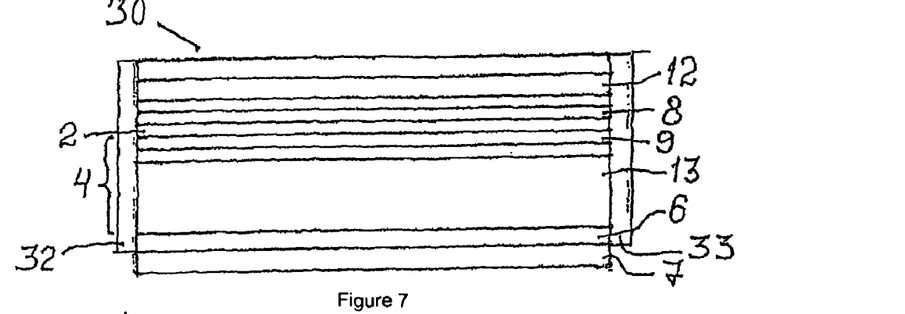
FIG. 7 is a schematic illustration of the longitudinal section of the proposed asymmetric Laser with reflective coatings on the optical facets, with one active layer, two main adjusting layers and two leak-in layers of different thicknesses located on each side of the active layer.

The following embodiment of the Laser 30 differed from the above in that in this embodiment the leak-in layers 12 and 13 were made with the same composition as the confining layers 11 and 10, namely, of $Al_{0.38}Ga_{0.62}As$. The reflective layers 5, 6 (without sublayers) were made of $Al_{0.45}Ga_{0.55}As$. This embodiment of the Laser 30, as compared with the previous ones, contained a lesser number of layers of HS 1.

The proposed Laser 30 (see FIG. 8) was made with the use of the embodiment of the asymmetric HS 1 presented in FIG. 4, in which two identical active layers 2 were made, and between them the main central adjusting layer 20 with a thickness of 0.012 µm was placed. In this embodiment of the Laser 30 the threshold current density was reduced to 0.25 kA/cm².

Figure 8:
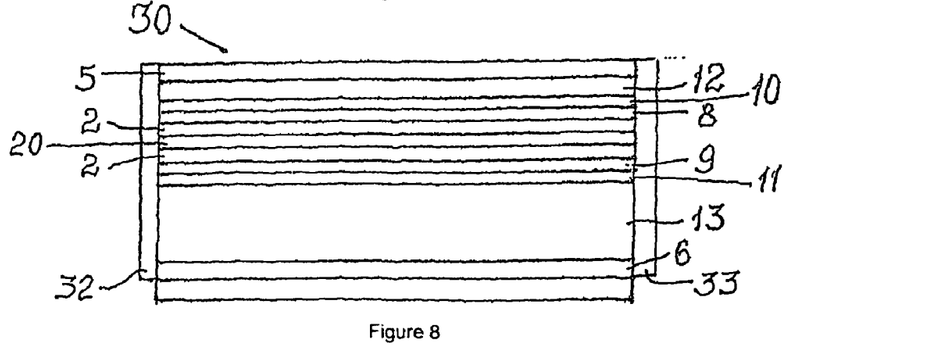
FIG. 8 is a schematic illustration of the longitudinal section of the proposed asymmetric Laser with reflective coatings on the optical facets, with two active layers, two main adjusting layers and one main central adjusting layer.

The following embodiment of the Laser 30 differed from the above in that the main central adjusting layer 20 consisted of two sublayers of the p-type and the n-type, each with a thickness of 0.005 µm, doped respectively with carbon and silicon with equal concentrations of current carriers of $5 \cdot 10^{19}$ cm$^{-3}$. In operation of the Laser 30 such sublayers provided the tunnel passage of current from one active layer to another, and at the same current, but approximately at the doubled applied voltage, output power increased by the power of two.

The proposed SAE 40 used also in the SOA was made on the basis of the embodiment of the HS 1 presented in FIG. 1. The SAE 40 of this embodiment and the method of its manufacturing completely coincided with the embodiment of the Laser 30 presented in FIG. 5, except that to the cleaved facets of the HS 1 the clarifying films with equal reflection coefficients $R_1$ and $R_2$ of 0.01% were applied. At all values of current the resulting amplification in the active layer defined by the compositions and thicknesses of the heterostructure layers as well as by the reflection coefficients $R_1$ and $R_2$ was less than its threshold value of self-excitation up to current densities of 10 kA/cm² and more. The condition of emission leak from the active layer to the leak-in layers (with a signal at the input) began to be met in case of exceeding a current density more than 0.3 kA/cm². The angle of leak φ in this case increases from 0° at 0.3 kA/cm² to 1.53° at 10 kA/cm². The entrance aperture of the SAE 40 at 10 kA/cm² was 8×10 µm², and the angular aperture was approximately 6.0°×5.7°.

The following embodiment of the SAE 40 (see FIG. 9) used in the SOA differed from the above by the width of the stripe region of current flow equal to 8 µm, the compositions and thicknesses of the HS 1 layers designed for a emission wavelength of 1305 nm, as well as in that to the optical facets 31 with the clarifying films 41 and 42 (for which $R_1$ and $R_2$ were identical and equal to 0.01%) the optical fibers were coupled: the input optical fiber 43 for input of emission through the input optical facet 31 with the clarifying film 41 and the output optical fiber 44 for output of emission from the opposite optical facet 31 with the clarifying film 42. The sizes of the entrance and exit apertures of the SAE 40 equal to 10×10 μm² were in conformity with the apertures of the known optical fibers, which made it possible to couple the input optical fiber 43 and the output optical fiber 44 to the optical facets 31 with the corresponding coatings 41 and 42 directly, in immediate contact with the SAE 40. This embodiment of the SAE 40 can be used with high efficiency as power amplifiers, optical switches, optical wavelength converters in modern fiber communication links. Its main advantage is reduced noise determined by low losses of input emission in its input into the SAE 40. The noise factor in this case can be comparable with that of fiber and Raman amplifiers. The near-square form of the region of propagation of amplified emission of 100 μm² makes the SAE 40 practically insensitive to polarization of an input signal. A small-signal amplification of a signal in such a SAE 40 more than 35 dB can be obtained, and the amplified power of emission without its saturation can reach 1 W and more. An advantage of the SAE 40 is also that its output amplified emission is practically symmetric and has a low angular divergence of emission.

Figure 9:
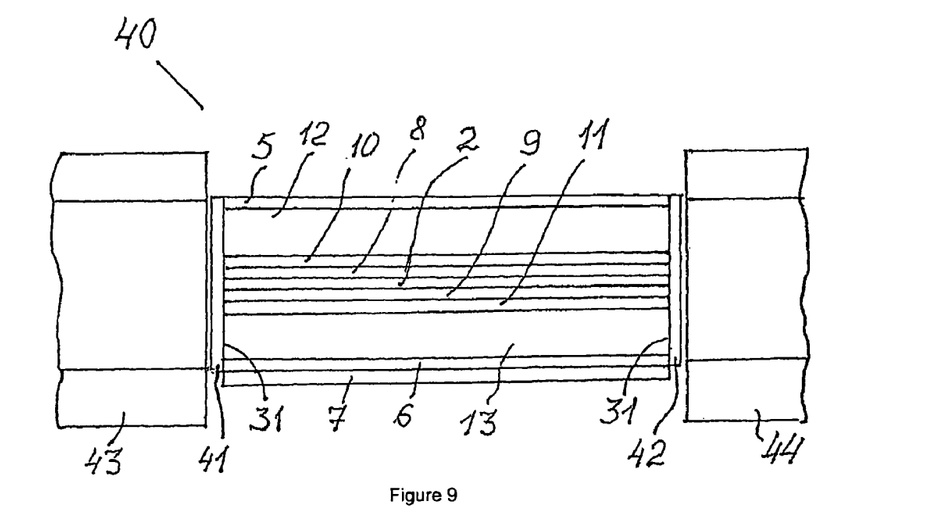
FIG. 9 is a schematic illustration of the longitudinal section of the SAE with clarifying films on the optical facets with two optical fibers coupled to them, with one active layer, two main adjusting layers and two identical leak-in layers located on each side of the active layer.

The following embodiment of the SAE 40 used in the SOA differed from the above in that the introduced mesa stripe region of current flow was made inclined to the cavity of the optical facet at an angle of 7°. This has made it possible to reduce the requirements to the value of reflection coefficients $R_1$ and $R_2$ approximately by an order of magnitude (10 times).

The proposed SAE 40 used also in the SOA was made on the basis of the embodiment of the HS 1 presented in FIG. 2. The SAE 40 of this embodiment and the method of its manufacturing completely coincided with the embodiment of the Laser 30 presented in FIG. 6, except that to the cleaved facets of the HS 1 the clarifying films with equal reflection coefficients $R_1$ and $R_2$ of 0.01% were applied.

The proposed SAE 40 used also in the SOA was made on the basis of the embodiment of the HS 1 presented in FIG. 3 and completely coincided with the embodiment of the Laser 30 presented in FIG. 7, except that to the cleaved facets of the HS 1 the clarifying films with equal reflection coefficients $R_1$ and $R_2$ of 0.01% were applied.

The proposed SAE 40 used also in the SOA was made on the basis of the embodiment of the HS 1 presented in FIG. 4 and completely coincided with the embodiment of the Laser 30 presented in FIG. 8, except that to the cleaved facets of the HS 1 the clarifying films 41, 42 with equal reflection coefficients of 0.01% were applied.

The following embodiment of the SAE 40 used also in the SOA differed from the embodiment of the Laser 30 with two active layers with the tunnel passage of current between them only by reflection coefficients of the clarifying films 41, 42 of 0.01%.

Figure 10:
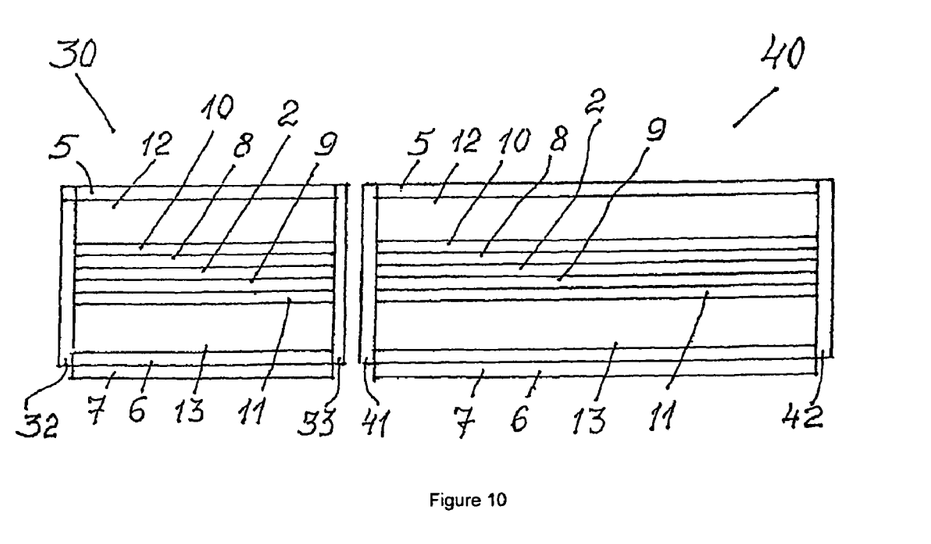
FIG. 10 is a schematic illustration of the longitudinal section of the SOA with independently located on one optical axis: the master Laser with reflective coatings on the optical facets and the SAE with clarifying films on the optical facets, made of the same symmetric HS with one active layer, two main adjusting layers and two identical leak-in layers located on each side of the active layer.

The proposed SOA (see FIG. 10) comprises a master source of input emission made as the Laser 30 optically coupled with the SAE 40. The Laser 30 and the SAE 40 are made with the use of the same embodiment of the HS 1 described above and schematically presented in FIG. 1. The Laser 30 coincides with the above embodiment schematically presented in FIG. 5. The distinction of the SAE 40 from the Laser 30 consists in the clarifying films 41, 42 with equal reflection coefficients of 0.01% applied to the cleaved facets 31. The stripe regions of current flow of the Laser 30 and the SAE 40 are made with the same width of 8 μm. The exit aperture of the Laser 30 and the entrance aperture of the SAE 40 are identical and equal to 8.0×8.0 μm², and the calculated angles of divergence $\theta_\perp$ in the vertical plane at a current density of 10 kA/cm² are 6.0°. The output power of the Laser 30 in the single-spatial-mode operation for two transverse indices is 0.5 W. The large and equal output aperture of the master Laser 30 and entrance aperture of the SAE 40 make it possible to align the master Laser 30 and the SAE 40 on one longitudinal optical axis with a shortest distance between them with sufficient accuracy and low losses of emission. Such a SOA is a superhigh-power source of high-quality single-mode and single-frequency laser emission.

INDUSTRIAL APPLICABILITY

The heterostructures are used for creation of semiconductor injection emission sources such as injection lasers, semiconductor amplifying elements, semiconductor optical amplifiers that are used in fiber optic communication and data transmission systems, in optical superhigh-speed computing and switching systems, in development of medical equipment, laser industrial equipment, frequency-doubled lasers, and for pumping solid-state and fiber amplifiers and lasers.

The invention claimed is:

1. A heterostructure based on semiconductor compounds, said heterostructure containing at least one active layer, at least two reflective layers, at least as one on each side of the active layer, said reflective layers forming at least of one sublayer and having refractive indices lesser than the effective refractive index $n_{eff}$ of the said heterostructure, said heterostructure containing a leak-in region, the leak-in region being transparent for emission and located between said active layer and a corresponding reflective layer, said leak-in region located at least on one side of said active layer, said leak-in region being at least one, said leak-in region including at least one leak-in layer having a refractive index $n_{IN}$ and consisting at least of one sublayer, as well as said leak-in region having at least one confining layer consisting at least of one sublayer, wherein into said leak-in region a main adjusting layer is additionally introduced, consisting at least of one sublayer and having at least for one of its sublayers a refractive index no less than the refractive index $n_{IN}$ of said leak-in layer, one of surfaces of said main adjusting layer being adjacent to said active layer, while on the opposite surface of said main adjusting layer there is said confining layer having a refractive index lesser than the refractive index of said main adjusting layer, wherein the ratio of the effective refractive index $n_{eff}$ of the heterostructure to the refractive index $n_{IN}$ of the leak-in layer, namely—the ratio of $n_{eff}$ to $n_{IN}$ is determined within the range from one plus delta to one minus delta, where delta is determined by a magnitude much lesser than one.

2. The heterostructure as defined in claim 1 wherein in the range of operating currents the ratio of $n_{eff}$ to $n_{IN}$ decreasing with increasing current and wherein the ratio of $n_{eff}$ to $n_{IN}$ is determined within the range of magnitudes from 1.01 to 0.99.

3. The heterostructure as defined in claim 1 wherein the said heterostructure contains at least two said active layers and between them the additionally introduced main central adjusting layer is located consisting at least of one sublayer and having a refractive index no less than the refractive index of the said leak-in layer $n_{IN}$.

4. The heterostructure as defined in claim 1 wherein in the said leak-in region an auxiliary adjusting layer adjacent to the surface of the said confining layer is introduced; the said auxiliary adjusting layer is formed at least of one sublayer and having a refractive index no less than the refractive index of the said leak-in layer $n_{IN}$.

5. The heterostructure as defined in claim 1 wherein at least one of the sublayers of the said reflective layer has a refractive index close to the refractive index of the said leak-in layer.

6. The heterostructure as defined in claim 1 wherein at least one said leak-in layer of the said leak-in region has a refractive index identical with the refractive index of the said confining layer.

7. The heterostructure as defined in claim 1 wherein at least one of the sublayers of the said leak-in layer of the said leak-in region has a composition identical or close with the composition of the substrate on which the said heterostructure is grown.

8. The heterostructure as defined in claim 1 wherein the said heterostructure contains at least two said active layers, the cavities of which are parallel to each other, and between them a main central adjusting layer is located, consisting of two thin heavily doped sublayers of the p-type and the n-type providing the tunnel passage of current from one said active layer to another in operation of the injection emission source.

9. The injection laser comprising a heterostructure as well as optical facets, reflectors, ohmic contacts, an optical resonator, in which at least part of the medium of said optical resonator made at least of part of the leak-in region, at least of part of the active layer, and at least of part of the reflective layer, reflection coefficients of the optical resonator reflectors as well as compositions and thicknesses of the heterostructure layers chosen in such a way that for said injection laser during its operation the resulting amplification of emission in said active layer is sufficient for upholding the lasing threshold throughout the whole range of the operating currents, wherein said heterostructure made as defined in any of claims 1 through 8, while the ratio of $n_{eff}$ to $n_{IN}$ in the range of lasing threshold currents is determined within the range from one plus gamma to one minus gamma, where gamma is defined by a magnitude lesser than delta.

10. The injection laser as defined in claim 9 wherein in the range of lasing threshold currents the ratio of $n_{eff}$ to $n_{IN}$ is determined from the range from about 1.005 to about 0.995.

11. The semiconductor amplifying element comprising a heterostructure as well as optical facets, ohmic contacts, and a clarifying film on at least one optical facet, in which the medium of propagation of the amplified emission of said semiconductor injection emission source are at least part of the leak-in region, at least part of the active layer, and at least part of the reflective layer, while the reflection coefficient of the said clarifying film on said optical facet as well as compositions and thicknesses of the said heterostructure layers is chosen in such a way that the value of resulting amplification of emission in the said active layer throughout the whole range of the operating currents is lesser than the value of resulting amplification bringing the said operating semiconductor amplifying element to self-excitation, wherein the said heterostructure made as defined in any of claims 1 through 8.

12. The semiconductor amplifying element as defined in claim 11 wherein the said leak-in layer of the said leak-in region has a thickness approximately equal to the width of the introduced stripe region of current flow.

13. The semiconductor amplifying element as defined in claim 11 wherein the said stripe region of current flow made inclined to the cavity of the optical facet at an said appropriate angle.

14. The semiconductor amplifying element as defined in claim 11 wherein the opposite said optical facets with the said clarifying films applied to them being optically coupled with the optical fibers.

15. The semiconductor optical amplifier comprising optically coupled master source of input emission and semiconductor amplifying element wherein the said semiconductor amplifying element made as defined in claim 11.

16. The semiconductor optical amplifier as defined in claim 15 wherein the said master source of input emission made as an injection laser.

17. The semiconductor optical amplifier as defined in claim 15 wherein the injection laser made as defined in claim 9.

18. The semiconductor optical amplifier as defined in claim 16 wherein the said injection laser and the said semiconductor amplifying element made of the same heterostructure and the optical coupling made in the immediate contact between them.

* * * * *